United States Patent
Avouris et al.

(10) Patent No.: US 8,003,453 B2
(45) Date of Patent: Aug. 23, 2011

(54) SELF-ALIGNED PROCESS FOR NANOTUBE/NANOWIRE FETS

(75) Inventors: Phaedon Avouris, Yorktown Heights, NY (US); Roy A. Carruthers, Stormville, NY (US); Jia Chen, Ossining, NY (US); Christopher G. M. M. Detavernier, Ghent (BE); Christian Lavoie, Ossining, NY (US); Hon-Sum Philip Wong, Palo Alto, CA (US)

(73) Assignee: International Business Machines Corporation, Armonk, NY (US)

( * ) Notice: Subject to any disclaimer, the term of this patent is extended or adjusted under 35 U.S.C. 154(b) by 78 days.

(21) Appl. No.: 12/125,501

(22) Filed: May 22, 2008

(65) Prior Publication Data
US 2008/0227259 A1 Sep. 18, 2008

Related U.S. Application Data

(60) Continuation of application No. 11/866,627, filed on Oct. 3, 2007, now abandoned, which is a division of application No. 11/031,168, filed on Jan. 7, 2005, now Pat. No. 7,598,516.

(51) Int. Cl.
*H01L 21/336* (2006.01)
(52) U.S. Cl. ......... 438/197; 257/E21.046; 257/E21.591; 438/597; 977/847
(58) Field of Classification Search .......... 257/9, 29, 257/77, 613, E21.041, E21.045–E21.046, 257/E21.591, E51.038, E51.04; 438/99, 438/105, 197, 597, 660, 931; 977/842, 847, 977/938
See application file for complete search history.

(56) References Cited

U.S. PATENT DOCUMENTS

| | | | |
|---|---|---|---|
| 7,101,761 B2 * | 9/2006 | Chau et al. | 438/283 |
| 7,306,823 B2 * | 12/2007 | Sager et al. | 427/217 |
| 7,361,958 B2 * | 4/2008 | Brask et al. | 257/369 |
| 2002/0163079 A1 * | 11/2002 | Awano | 257/750 |
| 2003/0178617 A1 | 9/2003 | Appenzeller et al. | |
| 2004/0036126 A1 * | 2/2004 | Chau et al. | 257/401 |
| 2004/0144972 A1 | 7/2004 | Dai et al. | |
| 2004/0214429 A1 | 10/2004 | Han et al. | |
| 2004/0238887 A1 * | 12/2004 | Nihey | 257/347 |
| 2004/0253805 A1 | 12/2004 | Dubin | |
| 2005/0199731 A9 * | 9/2005 | Empedocles et al. | 235/491 |

(Continued)

FOREIGN PATENT DOCUMENTS
WO WO03005451 1/2003

OTHER PUBLICATIONS

Wind, S.J., et al., "Vertical Scaling of Carbon Nanotube Field-Effect Transistors Using Top Gate Electrodes." Appl. Phys. Lett., vol. 80, No. 20 (May 20, 2002): pp. 3817-3819.*

(Continued)

*Primary Examiner* — Matthew W Such
(74) *Attorney, Agent, or Firm* — Scully, Scott, Murphy & Presser, P.C.; Vazken Alexanian

(57) ABSTRACT

A complementary metal oxide semiconductor (CMOS) device, e.g., a field effect transistor (FET), that includes at least one one-dimensional nanostructure that is typically a carbon-based nanomaterial, as the device channel, and a metal carbide contact that is self-aligned with the gate region of the device is described. The present invention also provides a method of fabricating such a CMOS device.

14 Claims, 8 Drawing Sheets

U.S. PATENT DOCUMENTS

| | | | |
|---|---|---|---|
| 2005/0212014 A1* | 9/2005 | Horibe et al. | 257/213 |
| 2005/0224807 A1 | 10/2005 | Ravi et al. | |
| 2006/0017138 A1 | 1/2006 | Ting | |
| 2006/0038179 A1* | 2/2006 | Afzali-Ardakani et al. | 257/67 |
| 2006/0091503 A1 | 5/2006 | Wu et al. | |
| 2006/0094166 A1 | 5/2006 | Kim et al. | |
| 2006/0094168 A1 | 5/2006 | Hoffman et al. | |
| 2006/0105523 A1* | 5/2006 | Afzali-Ardakani et al. | 438/257 |
| 2006/0113605 A1 | 6/2006 | Currie | |
| 2006/0138658 A1 | 6/2006 | Ravi et al. | |

OTHER PUBLICATIONS

Avouris, P., "Molecular Electronics with Carbon Nanotubes." Acc. Chem. Res., vol. 35, No. 12 (2002): pp. 1026-1034.*

Wind, S.J., et al. "Fabrication and Electrical Characterization of Top Gate Single-Wall Carbon Nanotube Field-Effect Transistors." J. Vac. Sci. Technol. B, vol. 20, No. 6 (Nov./Dec. 2002): pp. 2798-2801.*

Wind, S.J., et al. "Transistor Structures for the Study of Scaling in Carbon Nanotubes." J. Vac. Sci. Technol. B, vol. 21, No. 6 (Nov./Dec. 2003): pp. 2856-2859.*

Singh, D.V., et al., "Frequency Response of Top-Gated Carbon Nanotube Field-Effect Transistors." IEEE Trans. Nanotech., vol. 3, No. 3 (Sep. 3, 2004): pp. 383-387.*

Auvray, S., et al. "Carbon Nanotube Transistor Optimization by Chemical Control of the Nanotube-Metal Interface." Appl. Phys. Lett., vol. 84, No. 25 (Jun. 21, 2004): pp. 5106-5108.*

Guo, J., et al., "Assessment of Silicon MOS and Carbon Nanotube FET Performance Limits using a General Theory of Ballistic Transistors." IEEE International Electron Devices Meeting, 2002. IEDM Technical Digest (Dec. 8-11, 2002): pp. 711-714.*

Guo, J. et al., "Performance Analysis and Design Optimization of Near Ballistic Carbon Nanotube Field-Effect Transistors." IEEE International Electron Devices Meeting, 2004. IEDM Technical Digest (Dec. 13-15, 2004) pp. 703-706.*

Knoch, J. et al., "Comparison of Transport Properties in Carbon Nanotube Field-Effect Transistors with Schottky Contacts and Doped Source/drain Contacts." SOL. State Elect., vol. 49 (Aug. 23, 2004): pp. 73-76.*

Guo, J., et al., "Predicted Performance Advantages of Carbon Nanotube Transistors with Doped Nanotubes as Source/Drain." Cornell University Library: Open Access (Sep. 1, 2003). http://arxiv.org/abs/cond-mat/0309039.*

Derycke, V., et al., "Carbon Nanotube Inter- and Intramolecular Logic Gates." NANOLETT., vol. 1, No. 9 (Sep. 2001): pp. 453-456.*

Wind, S.J., et al., "Vertical Scaling of Carbon Nanotube Field-Effect Transistors Using Top Gate Electrodes." Appl. Phys. Lett., vol. 80, No. 20 (May 20, 2002): pp. 3817-3819.*

Derycke, V., et al., "Carbon Nanotube Inter- and Intramolecular Logic Gates." NANOLETT., vol. 1, No. 9 (Sep. 2001): pp. 453-456.*

Wind, S.J., et al., "Vertical Scaling of Carbon Nanotube Field-Effect Transistors Using Top Gate Electrodes." Appl. Phys. Lett., vol. 80, No. 20 (May 20, 2002): pp. 3817-3819.*

Derycke, V., et al., "Carbon Nanotube Inter- and Intramolecular Logic Gates." NANOLETT., vol. 1, No. 9 (Sep. 2001): pp. 453-456.*

Javey, A., et al. "Self_aligned Ballistic Molecular Transistors and Electrically Parallel nanotube Arrays." NANOLETT., vol. 4, No. 7 (Jun. 2004): pp. 1319-1322.*

Sarangi, D., et al. "Carbon Nanotubes and Nanostructures Grown From Diamond-Like Carbon and Polyethylene", Appl. Phys. A. vol. 73 (2001): pp. 765-768.

Lee, Jeong-O, et al. "Formation of Low-Resistance Ohmic Contacts Between Carbon Nanotube and Metal Electrodes by a Rapid Thermal Annealing Method." J. Phys. D.:Appl. Ahys. vol. 33 (2000): pp. 1953-1956.

Zhang, Y., et al., "Heterostructures of Single-Walled Carbon Nanotubes and Carbide Nanorods." Science vol. 285 1999: pp. 1719-1722.

* cited by examiner

SELF-ALIGNED PROCESS FOR NANOTUBE/NANOWIRE FETS

RELATED APPLICATIONS

This application is a continuation application of U.S. Ser. No. 11/866,627, filed Oct. 3, 2007 now abandoned, which is a divisional application of U.S. Ser. No. 11/031,168, filed Jan. 7, 2005, now U.S. Pat. No. 7,598,516.

FIELD OF THE INVENTION

The present invention relates to a semiconductor structure and a method of fabricating the same. More particularly, the present invention relates to a complementary metal oxide semiconductor (CMOS) device, e.g., a field effect transistor (FET), that comprises at least one one-dimensional nanostructure that is typically a carbon-based nanomaterial, as the device channel, and a metal carbide contact that is self-aligned with the gate region of the device, i.e., aligned to an edge of the gate region. The present invention also provides a method of fabricating such a CMOS device.

BACKGROUND OF THE INVENTION

In the field of molecular nanoelectronics, few materials show as much promise as one-dimensional nanostructures, and in particular carbon nanotubes that comprise hollow cylinders of graphite that have a diameter of a few Angstroms. Nanotubes and other like one-dimensional nanostructures can be implemented in electronic devices, such as, for example, diodes and transistors, depending on the nanoparticles electrical characteristics. One-dimensional nanostructures are unique for their size, shape, and physical properties. For example, carbon-based nanotubes resemble a hexagonal lattice of carbon rolled into a cylinder.

Besides exhibiting intriguing quantum behaviors even at room temperature, carbon-based nanotubes exhibit at least two important characteristics, a nanotube can be either metallic or semiconducting depending on its chirality, i.e., conformational geometry. Metallic nanotubes can carry an extremely large current density with constant resistivity. Semiconducting nanotubes can be electrically switched "on" or "off" as field effect transistors (FETs). The two types may be covalently joined (sharing electrons). These characteristics point to nanotubes as excellent materials for making nanometer-sized semiconductor circuits. Similar properties exist for other one-dimensional nanostructures.

Carbon-based nanotubes and other like one-dimensional nanostructures are thus becoming strategically important for post-Si FET scaling. However, there is no known self-aligned process comparable to conventional CMOS technology. A self-aligned process for a CMOS device including one-dimensional nanostructures would provide a simpler sequence of processing steps as compared to a non-self-aligned process and it reduces processing error that typically occurs when a non-self-aligned process is used. Moreover, a self-aligned process provides a structure having reduced parasitics as compared to a non-self-aligned structure.

In view of the above, there is a need for providing a self-aligned process for fabricating a CMOS device that includes one-dimensional nanostructures, such as nanotubes and nanowires.

SUMMARY OF THE INVENTION

The present invention provides a self-aligned one-dimensional nanostructure-containing field effect transistor (FET) as well as a method of fabricating the same. The inventive self-aligned one-dimensional nanostructure-containing FET includes a metal carbide as a contact that is aligned to an edge of the gate region that includes the nanostructures as the device channel.

In the present invention, the term "one-dimensional nanostructure" is used to describe at least one nanotube and/or at least one nanowire. Nanotubes differ from nanowires because nanotubes typically have a hollow cavity, whereas nanowires are completely filled nanomaterials. The term "nanorods" is sometimes used in describing nanowires. One-dimensional nanostructures are structures with nanometer-sized diameters and much, much longer lengths. In other words, the structures have a high aspect ratio and quantum effects become important for these systems.

Specifically and in broad terms, the inventive one-dimensional nanostructure-containing FET comprises:

a substrate comprising at least one gate region located thereon, said at least one gate region comprising a layer of at least one one-dimensional nanostructure; and a metal carbide contact located on a surface of said substrate that is aligned to an edge of said layer of at least one one-dimensional nanostructure.

In one embodiment of the present invention, the one-dimensional nanostructure is a nanotube. In another embodiment of the present invention, the one-dimensional nanostructure is a nanowire. The at least one one-dimensional nanostructure used in the present invention is typically a carbon-based nanomaterial that is formed utilizing techniques well known to those skilled in the art of nanotechnology.

In addition to providing the aforementioned semiconductor structure, the present invention also provides a method of fabricating the same. The inventive method includes the steps of:

providing a structure that includes at least one gate stack on a surface of a layer of at least one one-dimensional nanostructure;

forming a source/drain metal on the structure including at least said layer of at least one one-dimensional nanostructure; and forming a metal carbide by reacting said source/drain metal with said layer of at least one one-dimensional nanostructure.

In some embodiments of the present invention, the portion of the layer of the at least one one-dimensional nanostructure, not protected by the at least one gate stack, is doped. In such an embodiment, the metal carbide is formed on the exposed and undoped portion of the layer of at least one one-dimensional nanostructure.

In another embodiment of the present invention, spacers are formed on the sidewalls of the at least one gate stack prior to forming the metal carbide. Spacers are used when a self-aligned silicide anneal process is used. If a non self-aligned silicide anneal is used, the spacers may be omitted.

In another embodiment of the present invention, the at least one one-dimensional nanostructure is embedded within a conductive compound that is generated by the reaction of the source/drain metal with an underlying substrate that includes C or oxide. The embedding occurs during the carbide annealing step mentioned above.

DETAILED DESCRIPTION OF THE INVENTION

Figure 1A:
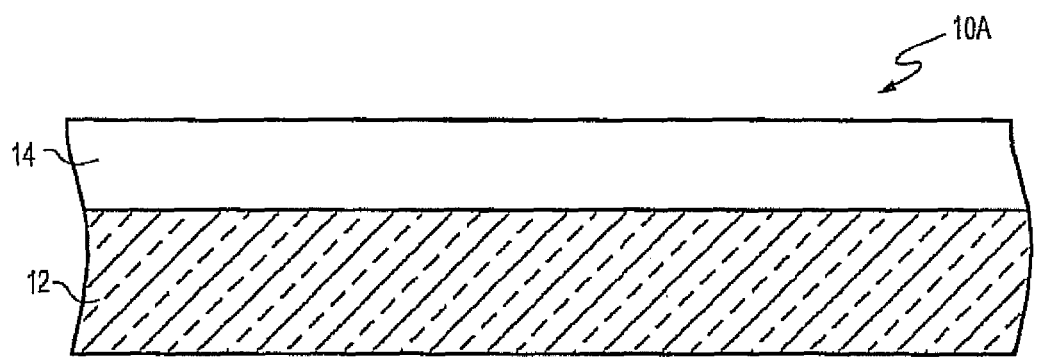
FIGS. 1A-1B are pictorial representations (through cross sectional views) illustrating various types of initial substrates that can be employed in the present invention.

The present invention, which provides a one-dimensional nanostructure-containing FET and a method of fabricating the same, will now be described in greater detail by referring to the drawings that accompany the present application. The various drawings of the present invention are provided for illustrative purposes and thus they are not drawn to scale. Also, the drawings depict the presence of a single gate region; the term "gate region" is used herein to denote the gate, gate electrode and underlying device channel. Although a single gate region is depicted and described, the present invention also contemplates forming a plurality of such gate regions and thus a plurality of one-dimensional nanostructure-containing FETs on a surface of a substrate.

Figure 1B:
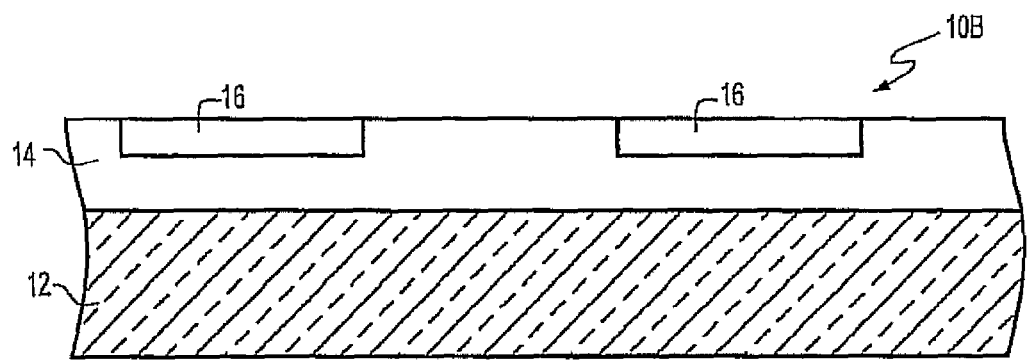

The present invention begins with first providing the initial substrate shown in either FIG. 1A or FIG. 1B. The initial substrate 10A shown in FIG. 1A comprises a semiconductor layer 12 which includes a dielectric layer 14 thereon. The semiconductor layer 12 includes any type of semiconducting material including, but not limited to: Si, SiGe, SiC, SiGeC, GaAs, InAs, InP or any other III/V or II/VI compound semiconductor. The semiconductor layer 12 may also comprise a layered semiconductor such as, for example, Si/SiGe or Si/SiGeC. Alternatively, the semiconductor layer 12 may comprise a silicon-on-insulator (SOI) or a silicon germanium-on-insulator (SGOI). The semiconductor layer 12 can be undoped or doped with one or more doping regions at this point of the present invention. Also, the semiconductor layer 12 may be strained or unstrained and it may have any crystallographic orientation including, for example, (111), (110) or (100). Also, the semiconducting substrate 12 can be used either for a back gate or for building other devices nearby (on the same chip or not) with conventional techniques.

In some embodiments of the present invention, when the dielectric layer 14 is thick, the semiconductor layer 12 may be replaced with a handling substrate such as a metal or glass. The present invention also contemplates embodiments when the entire substrate is comprised of the dielectric layer 14.

The dielectric layer 14 may comprise an oxide, a nitride, an oxynitride, a carbon containing dielectric such as, diamond like carbon (DLC) or fluorinated DLC, a high k dielectric (k greater than 4.0, typically greater than 7.0), an organic dielectric or multilayers thereof. In one embodiment, the dielectric layer 14 comprises an oxide such as $SiO_2$ or a nitride such as $Si_3N_4$. In another embodiment, the dielectric layer 14 comprises a DLC layer.

The dielectric layer 14 shown in FIG. 1A is formed on the surface of the semiconductor layer 12 utilizing a conventional deposition process such as, for example, chemical vapor deposition (CVD), plasma-enhanced chemical vapor deposition (PECVD), chemical solution deposition, sputtering, atomic layer deposition (ALD), physical vapor deposition (PVP), spin-on coating, epitaxial growth and other like deposition processing. In an alternate embodiment of the present invention, the dielectric layer 14 can also be formed by thermal oxidation, nitridation or oxynitridation.

The thickness of the dielectric layer 14 formed atop the semiconductor layer 12 may vary depending on the type of dielectric material employed as well as the technique that was used to form the same. Typically, the dielectric layer 14 has a thickness from about a fraction of a nanometer to about 500 nm, with a thickness from about 1 to about 10 nm being more typical. The aforementioned ranges are for semiconductor substrates and for back gate processes. For substrates without electrical functionality, the whole substrate can be a dielectric or the dielectric thickness can be extremely thick.

FIG. 1B shows another substrate 10B that can be used in the present invention. Specifically, the initial substrate 10B shown in FIG. 1B includes a semiconductor layer 12, a dielectric layer 14, and regions of a C-containing compound 16 embedded within the dielectric layer 14. The C-containing compound 16 can be any compound material that includes C such as, for example, DLC, or fluorinated DLC. The C-containing compound 16 is formed by blanket depositing the dielectric layer 14 on the surface of the semiconductor layer 12, forming a patterned photoresist (not shown) on the surface of the dielectric layer 14 and etching an opening into the dielectric layer 14 which defines the area for the embedded C-containing compound 16. The patterned photoresist is formed by conventional processing including applying a photoresist to the surface of the dielectric layer 14, exposing the photoresist to a pattern of radiation and developing the exposed photoresist utilizing a conventional resist developer. The etching step, which forms an opening into the dielectric layer 14, includes a dry etching process such as reactive-ion etching, ion beam etching, plasma etching or laser ablation. In addition to dry etching, the present invention also contemplates using a wet etch to provide the openings for forming the embedded regions within the dielectric layer 14.

With the patterned mask in place, the C-containing compound 16 is deposited forming the structure shown, for example, in FIG. 1B. The depth of the C-containing compound 16 formed into the dielectric layer 14, as measured from the upper surface of the dielectric layer 14, is from about 1 nm to about 500 nm or more, with a depth from about 5 to about 20 nm being more typical.

Unless otherwise specified, the description that follows utilizes the initial substrate 10A. Although initial substrate 10A is specifically utilized, the present invention and the following processing steps work equally well for the alternative initial substrate 10B shown in FIG. 1B or with a non-semiconducting substrate.

Figure 2:
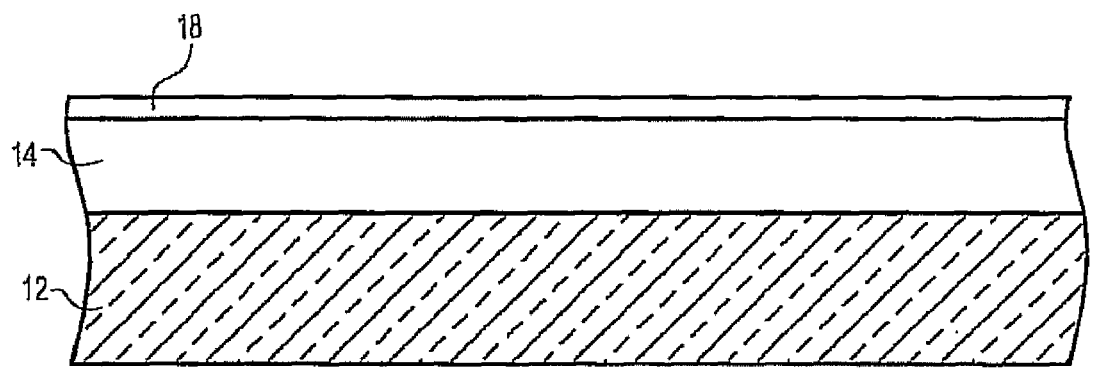
FIG. 2 is a pictorial representation (through a cross sectional view) illustrating the initial substrate of FIG. 1A after forming a layer of at least one one-dimensional nanostructure thereon.

Next, and as shown in FIG. 2, a layer of at least one one-dimensional nanostructure 18 is formed atop the dielectric layer 14; in the case in which initial substrate 10B is utilized, the layer of at least one one-dimensional nanostructure 18 is formed atop the surfaces of both the dielectric layer 14 and the embedded C-containing compound 16.

The layer of at least one one-dimensional nanostructure 18 may include a nanotube, a nanowire or a combination of these two types of nanomaterials. As stated above, nanotubes differ from nanowires because nanotubes typically have a hollow cavity, whereas nanowires are completely filled nanomaterials. One-dimensional nanostructures are structures with nanometer-sized diameters and much, much longer lengths. In other words, the structures have a high aspect ratio and quantum effects become important for these systems.

In one highly preferred embodiment of the present invention, the layer of at least one one-dimensional nanostructure 18 comprises nanotubes, while in another highly preferred embodiment of the present invention the layer of at least one one-dimensional nanostructure 18 comprises nanowires.

The nanotubes that can be used in the present invention are single walled or multi-walled nanomaterials that have an outer diameter that is typically from about 0.4 nm to about 30 nm, with an outer diameter from about 0.8 nm to about 2.5 nm being more typical, and a length that is typically from about 5 nm to about 100 μm, with a length from about 10 nm to about 10 μm being more typical. In addition to having an outer diameter, the nanotubes that can be used in the present invention have an inner diameter that is typically from about 0.4 nm to about 15 nm, with an inner diameter from about 0.8 nm to about 2.5 nm being more highly typical. The nanotubes useful in the present invention are further characterized as having a high aspect ratio that is typically on the order of about 5 or greater, with an aspect ratio from about 5 to about 5000 being more typical.

The nanowires that can be used in the present invention comprise various atomic layers, i.e., more than one shell, in which the outer diameter is typically from about 0.4 nm to about 100 nm, with an outer diameter from about 0.8 nm to about 50 nm being more typical, and a length that is from about 5 nm to about 100 μm, with a length from about 10 nm to about 10 μm being more typical. The nanowires useful in the present invention are further characterized as having a high aspect ratio that is typically on the order of about 5 or greater, with an aspect ratio from about 5 to about 5000 being more typical.

The layer of at least one one-dimensional nanostructure 18 employed in the present invention typically includes a C-based nanomaterial that has a hexagonal lattice structure that is rolled up. That is, the nanostructures of the present invention typically are comprised of carbon, e.g., graphite. Although C-based nanomaterials are preferably used, the present invention also contemplates other types of nanomaterials such as metallic or a combination of C-based and metallic.

The thickness of the layer of at least one one-dimensional nanostructure 18 formed at this point of the present invention can vary depending on the technique that was used to form the same. Typically, the layer of at least one one-dimensional nanostructure 18 has a thickness from about 0.4 to about 500 nm, with a thickness from about 0.8 to about 50 nm being more typical. In embodiments in which nanotubes are used, the layer of nanotubes 18 typically has a thickness from about 0.8 to about 3 nm.

The term "layer of at least one one-dimensional nanostructure" is used herein to denote a layer that includes at least one nanotube or nanowire as well a layer that contains a controlled and selected number of such one-dimensional nanostructures. Preferably, layer 18 includes a plurality of one-dimensional nanostructures thus the remaining text uses the phrase "layer of one-dimensional nanostructures".

The layer of one-dimensional nanostructures 18 can be formed utilizing techniques that are well known in the art. For example, carbon-based nanotubes can be produced by arc-discharge and laser ablation of a carbon target. Alternatively, carbon-based nanotubes can be made by chemical vapor deposition in the presence of metallic particles. Specific process details for nanotube formation that can be used in the present invention can be found, for example, in S. Iijima, et al. "Helical Microtubes of Graphite Carbon", Nature 354, 56 (19991); D. S. Bethune, et al. "Cobalt Catalyzed Growth of Carbon Nanotubes with Single-Atomic-Layer Walls" Nature 363, 605 (1993), and R. Saito, et al. "Physical Properties of Carbon Nanotubes", Imperial College Press (1998); the entire content of each is incorporated herein by reference. Also, the catalyst-free growth method disclosed in co-assigned U.S. Patent Application No. 2004/0035355 A1 can be used in fabricating nanotubes that can be used as layer 18. The entire content of the '355 published application is also incorporated herein by reference. In one embodiment of the present invention, the layer of carbon nanotubes 18 is formed by chemical vapor deposition at 900° C. for 10 min using Fe catalyst particles.

Carbon-based nanowires can also be produced by arc-discharge and laser ablation of a carbon target. Alternatively, carbon-based nanowires can be made by chemical vapor deposition in the presence of metallic particles. Specific process details for nanowire formation that can be used in the present invention can be found, for example, in S. Botti, et al., Chemical Physics Letters vol. 355, no. 5-6: 395-9, 8 Apr. 2002; the entire content of which is incorporated herein by reference. In one embodiment of the present invention, the layer of carbon nanowires 18 is formed utilizing laser-induced chemical vapor deposited amorphous hydrogenated carbon nanoparticles (from a mixture of ethylene and acetylene) as precursor (see, for example, S. Botti, et al, J. Appl. Phys. 88, 3396 (2000)), and depositing them onto a heated surface using the following conditions: a pressure of about 0.04 atmospheres, a substrate temperature of about 1100° C., a deposition time of about 90 min in an Ar carrier at a flow of about 300 sccm.

Despite illustrating the above techniques for forming the layer of one dimensional nanostructures 18, the present invention also contemplates other techniques that are capable of forming such nanostructures. For example, solution-phase decomposition, sol-gel electrophoresis, or wet-chemical, hydrothermal synthesis can be used in forming one-dimensional nanostructures.

After forming the layer of one-dimensional nanostructures 18 on the surface of one of the initial substrates shown in FIG. 1A or 1B, a gate dielectric 20 is formed on the surface of layer 18; See FIG. 3. In embodiments in which the at least one one-dimensional nanostructure is formed directly within a semiconductor substrate, the gate dielectric 20 can be formed by a thermal growing process such as, for example, oxidation, nitridation or oxynitridation. Alternatively, the gate dielectric 20 can be formed by a deposition process such as, for example, chemical vapor deposition (CVD), plasma-assisted CVD, atomic layer deposition (ALD), evaporation, reactive sputtering, chemical solution deposition or other like deposition processes. The gate dielectric 20 may also be formed utilizing any combination of the above processes.

The gate dielectric 20 is comprised of an insulating material including, but not limited to: an oxide, nitride, oxynitride and/or silicate including metal silicates and nitrided metal silicates. In one embodiment, it is preferred that the gate dielectric 20 is comprised of an oxide such as, for example, $SiO_2$, $HfO_2$, $ZrO_2$, $Al_2O_3$, $TiO_2$, $La_2O_3$, $SrTiO_3$, $LaAlO_3$ or mixtures thereof.

The physical thickness of the gate dielectric 20 may vary, but typically, the gate dielectric 20 has a thickness from about 0.5 to about 100 nm, with a thickness from about 0.5 to about 10 nm being more typical.

After forming the gate dielectric 20, a blanket layer of a gate electrode 22 is formed on the gate dielectric 20 utilizing a known deposition process such as, for example, physical vapor deposition, CVD or evaporation. The thickness, i.e., height, of the gate electrode 22 deposited at this point of the present invention may vary depending on the deposition process employed. Typically, the gate electrode 22 has a vertical thickness from about 5 to about 180 nm, with a thickness from about 5 to about 50 nm being more typical.

The gate electrode 22 can comprise any conductive material that is typically employed as a gate of a CMOS structure. Illustrative examples of such conductive materials that can be employed as the gate electrode 22 include, but are not limited to: polysilicon, conductive metals, conductive metal alloys, conductive silicides, conductive nitrides, polySiGe or combinations thereof, including multilayers thereof. In some embodiments (not shown), a gate cap comprised of an oxide or nitride can be formed atop the gate electrode 22. Also, it is possible to form a barrier layer between multiple layers of gate electrode materials.

Figure 3:
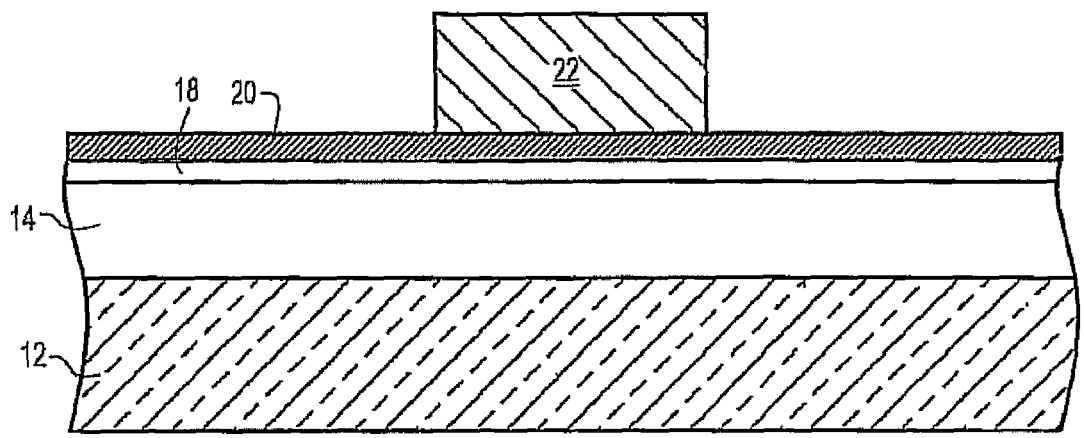
FIG. 3 is a pictorial representation (through a cross sectional view) illustrating the structure of FIG. 2 after forming a gate dielectric and a patterned gate electrode thereon.

The blanket layer of gate electrode 22 is then patterned providing the structure shown in FIG. 3. Patterning of the blanket layer of gate electrode 22 can be achieved utilizing conventional techniques that are well known in the art. For example, patterning of the gate electrode 22 can be performed by lithography and etching. The lithographic step includes applying a photoresist (not shown) to the upper surface of the gate electrode 22 (or optional gate cap, if present), exposing the photoresist to a desired pattern of radiation and developing the exposed photoresist utilizing a conventional resist developer. The pattern in the photoresist is then transferred to the blanket layer of gate electrode 22 (or optional gate cap first and then gate electrode 22) utilizing one or more etching steps. The etching includes a dry etching process, such as reactive ion etching, ion beam etching, plasma etching or laser ablation. Wet etching can also be used to pattern the gate electrode 22. As shown, the etching step selectively etches portions of the gate electrode 22, stopping atop the gate dielectric 20. The patterned photoresist is typically removed after the pattern has been transferred into the gate dielectric 20 utilizing a conventional stripping process. The dimensions of the gate formed can vary from about 3 nm to several micrometers, preferably between 7 nm and 1 μm.

Figure 4:
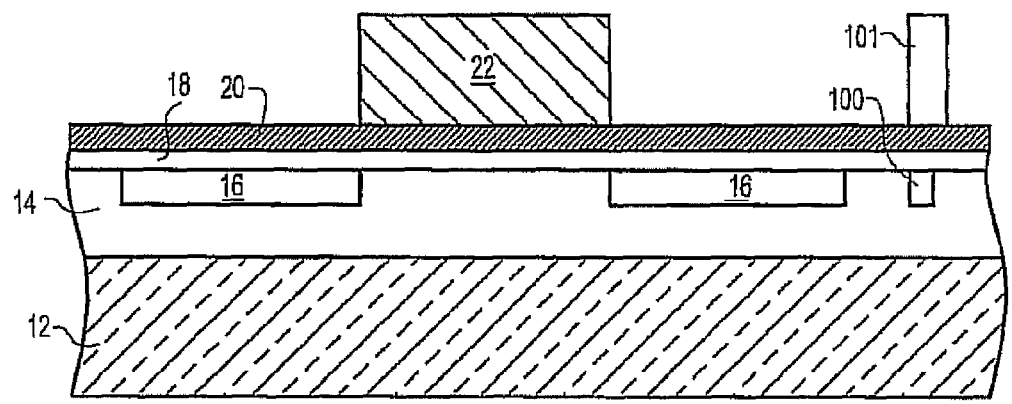
FIG. 4 is a pictorial representation (through a cross sectional view) illustrating a structure similar to that shown in FIG. 3 except that the initial substrate used is the one illustrated in FIG. 1B and alignment marks are utilized. Note that if the gate is much smaller than the contacts, part of the device could be built out of metallic nanotubes instead of semiconducting ones.

FIG. 4 illustrates a structure similar to that shown in FIG. 3 except that the initial substrate used is the one illustrated in FIG. 1B and alignment marks 100 and/or 101 are utilized. The alignment mark 100 is formed into the substrate, while the alignment mark 101 is formed atop the surface of the gate dielectric 20. The alignments marks 100 and 101 are formed utilizing a conventional process well known in the art and they serve to align the gate level to the underlying substrate.

Figure 5:
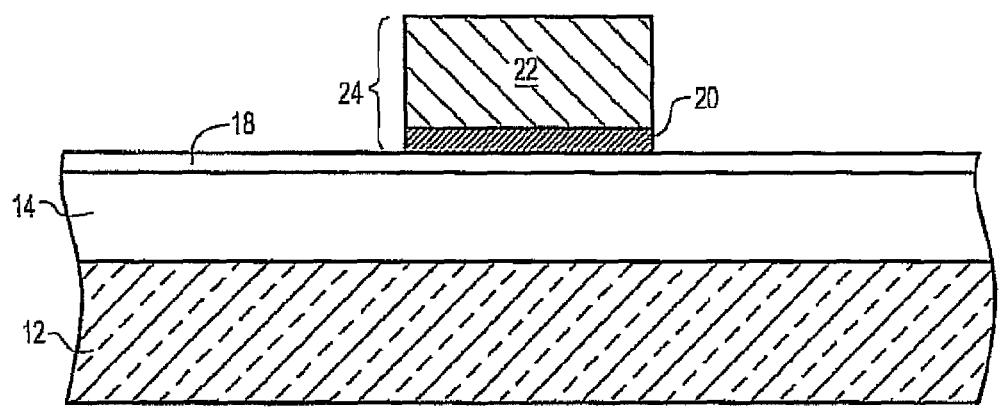
FIG. 5 is a pictorial representation (through a cross sectional view) illustrating the structure of FIG. 3 after patterning the gate dielectric.

FIG. 5 shows the structure after the exposed regions of gate dielectric 20, not including the patterned gate electrode 22 (and gate cap, if present), are removed. The removal of the exposed portion of the gate dielectric 20 is performed utilizing an etching process that selectively removes gate dielectric material as compared with a gate conductor and/or the layer of one-dimensional nanostructures 18. Dry etching or wet etching is contemplated herein for selectively removing the exposed portions of the gate dielectric 20. As illustrated, this removal steps exposes a portion of the layer 18 that is adjacent to the gate stack 24. Gate stack 24 includes at least the patterned gate electrode 22 and the patterned gate dielectric 20. Although a single gate stack 24 is shown, a plurality of such gate stacks can be formed as described above.

Figure 6:
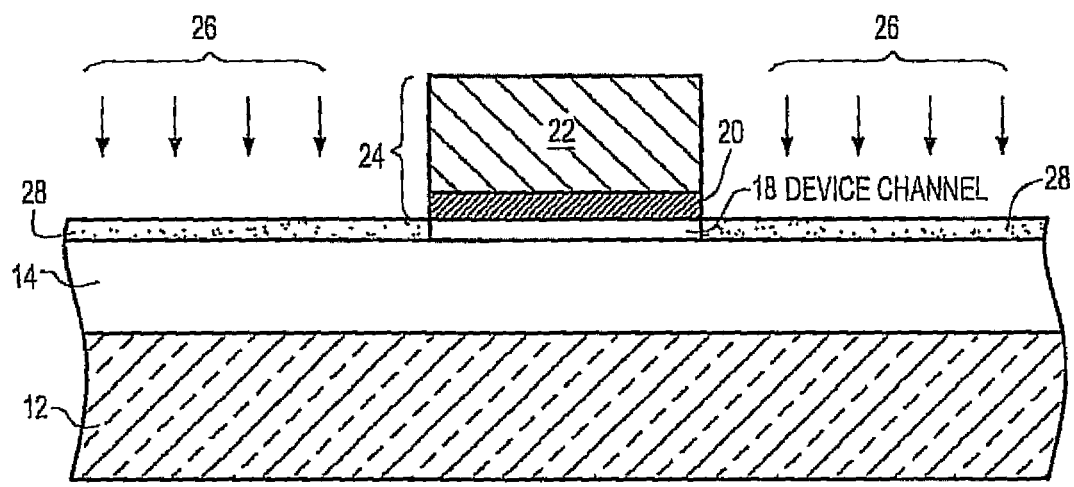
FIG. 6 is a pictorial representation (through a cross sectional view) illustrating the structure of FIG. 5 during optional doping of the exposed portion of the layer of at least one one-dimensional nanostructure.

Next, and as shown in FIG. 6, the exposed portion of layer 18 is then optionally doped with a first conductivity type dopant 26 (either n-type or p-type) to provide an optional dopant region 28. It is emphasized that the doping of the exposed portion of layer 18 is optional and is not used in all instances. The doping can be performed by electrostatic doping, gas phase doping or other like doping techniques. Ion implantation can be used if the layer of one-dimensional nanostructures 18 includes nanowires. The dopant 26 can be an n-type dopant which includes at least one element from Group VA of the Periodic Table of Elements, or the dopant 26 can be a p-type dopant that includes at least one element from Group IIIA of the Periodic Table of Elements. The doping provides dopant region 28 which typically has a doping concentration from about $10^{19}$ to about $10^{22}$ atoms/cm$^3$. More typically, the dopant region 28, which is located in the exposed portion of layer 18, has a dopant concentration from about $10^{21}$ to about $10^{22}$ atoms/cm$^3$.

Figure 7:
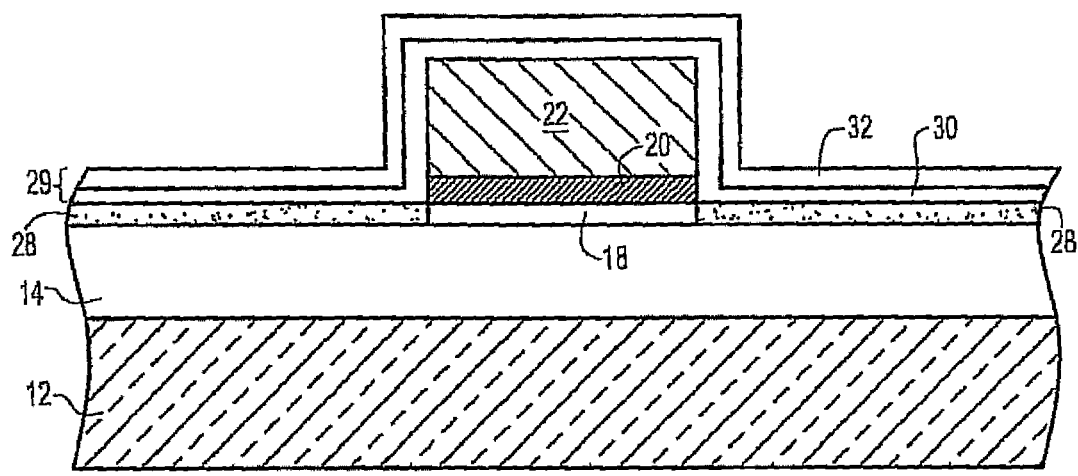
FIG. 7 is a pictorial representation (through a cross sectional view) illustrating the structure of FIG. 6 after forming optional first and second dielectric layers.

Next, and as shown in FIG. 7, dielectric stack 29 comprising one or more dielectric layers is optionally formed. It is noted that the dielectric stack 29 is used to provide spacers on the sidewalls of the gate stack 24. In some embodiments where a self-aligned anneal is used, spacer formation is required. In yet other embodiments where a non self-aligned anneal is used, spacer formation is not required.

In some embodiments of the present invention, the dopant implantation step can occur prior to formation of the spacers or after formation of one of the spacers and after formation of the other spacer.

In the embodiment illustrated, dielectric stack 29 includes a first dielectric layer 30 and a second dielectric layer 32. The dielectric stack 29 comprises a dielectric material such as, for example, an oxide, nitride, or oxynitride. A conventional deposition process such as described for the formation of the gate dielectric 20 can be employed in forming the dielectric stack 29. Alternatively, the dielectric stack 29 is formed by a thermal process. The thickness of the dielectric stack 29 may vary, but typically the overall thickness of the dielectric stack 29 is from about 5 to about 100 nm.

In some embodiments, the dielectric stack 29 and subsequent spacer formation can occur prior to the optional doping step mentioned above.

In FIG. 7, the dielectric stack 29 includes a first dielectric (i.e., inner spacer material) 30 and a second dielectric (i.e., outer spacer material) 32 which are composed of different dielectric materials. In one embodiment, first dielectric 30 is comprised of a nitride such as silicon nitride and second dielectric 32 is comprised of an oxide such as silicon dioxide.

Figure 8:
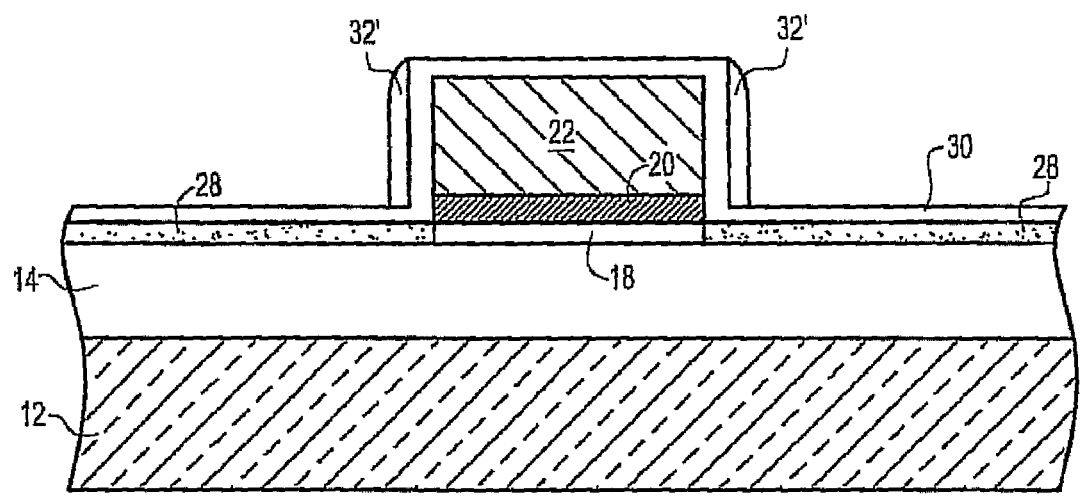
FIG. 8 is a pictorial representation (through a cross sectional view) illustrating the structure of FIG. 7 after the second dielectric layer has been selectively etched.
Figure 9:
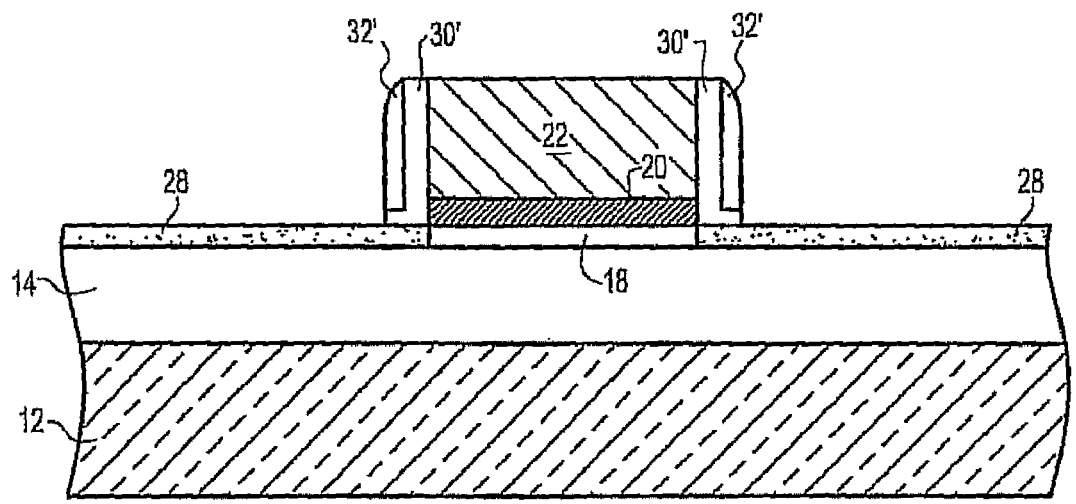
FIG. 9 is a pictorial representation (though a cross sectional view) illustrating the structure of FIG. 8 after the first dielectric layer has been selectively etched.

Etching is then performed to remove the dielectric stack 29 from all horizontal surfaces that were previously covered during deposition. The etching is shown in FIGS. 8 and 9. Specifically, dry etching, wet etching or a combination thereof is used. As shown in the specific embodiment, a first etch is used to selectively remove the second dielectric 32 from horizontal surfaces of the structures (See FIG. 8), and then a second etch is used to remove the first dielectric 30 from horizontal surfaces of the structure. The resultant structure including inner spacer 30' and outer spacer 32' is shown in FIG. 9. Although dual spacers are shown, the present invention contemplates a single spacer or multiple spacers located on the sidewall of the gate stack 24.

Figure 10:
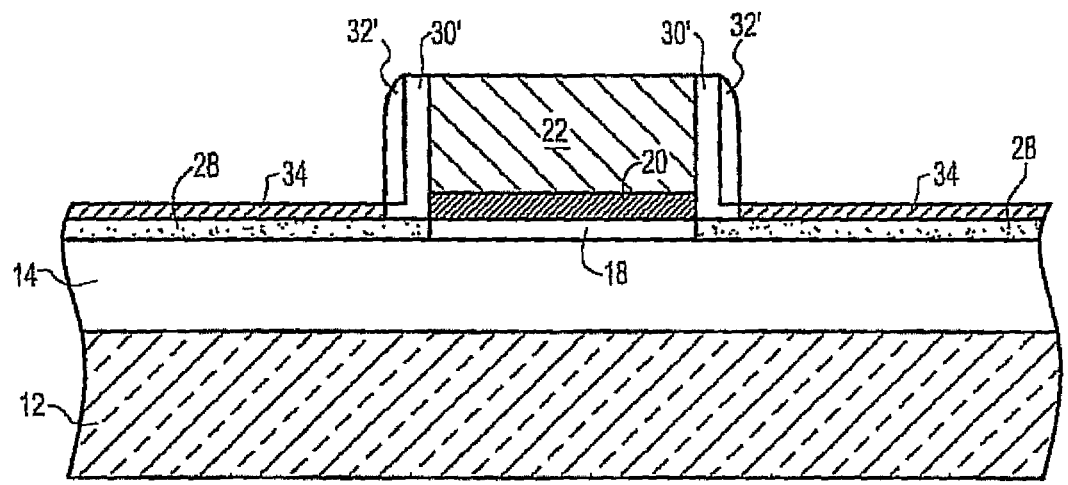
FIG. 10 is a pictorial representation (through a cross sectional view) illustrating the structure of FIG. 9 after performing an optional step in which a metal compound is formed over the optionally doped portion of the layer of at least one one-dimensional nanostructure.

In an optional embodiment of the present invention, such as shown in FIG. 10, a layer of metal compound 34 is formed atop the dopant region 28 that was previously formed into the layer of one-dimensional nanostructures 18. When employed, the layer of metal compound 34 can also be formed atop the exposed and undoped portion of layer 18. The layer of the metal compound 34 functionalizes the dopant region 28 (or alternatively the exposed and undoped portion of layer 18) and aids in the formation of metal carbide regions. The layer of the metal compound 34 comprises, for example, c-$C_4H_6$=Mo=O (where c stands for cyclic) such as described in H. Oudghiri-Hassani et al, "Passivation of metal carbide surfaces: relevance to carbon nanotube-metal interconnections", Applied Surface Science, 212-213, p 4-9 (2003) where the double bond between the organic group and the conducting carbide can be useful in 1) molecular electronics applications; 2) some molybdenum alkylidene compounds are active for metathesis family of reaction to grow covalently grafted polymeric layers for passivation or manipulation of metal carbide contacts (see, for example, K. J. Ivin et al, Olefin Metathesis and Metathesis Polymerization, Academic Press, San Diego, 1997; A. Furstner et al, Angew. Chem. Int. Ed. Engl. 39 3012 (2000)).

The layer of metal compound 34 can be deposited selectively such that it reacts chemically with the layer of one-dimensional nanostructures. When a selective deposition is employed, the layer 34 can go underneath the sidewalls if undercutting occurs (this occurs in instances in which a non-directional etch is used). In some embodiments, a mask level (formed by reactive-ion etching or liftoff) is used during the deposition of layer 34 such that the layer 34 does not extend beneath the sidewalls. The thickness of the layer of the metal compound 34 may vary depending on the complex used as well as the technique that was used to form the same.

Figure 11:
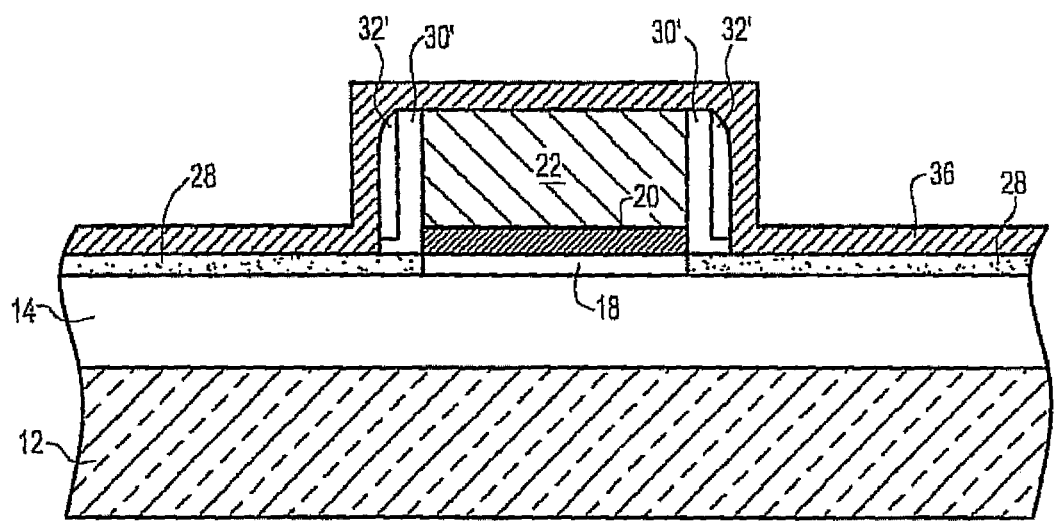
FIG. 11 is a pictorial representation (through a cross sectional view) illustrating the structure of FIG. 9 after forming a source/drain metal layer thereon.

Next, a source/drain metal 36 is formed at least atop the exposed dopant region 28 that was previously formed into portions of layer 18 as shown in FIG. 11. In another embodiment, source/drain metal 36 is formed at least atop the layer of metal compound 34 shown in FIG. 10. In yet another embodiment of the present invention, the source/drain metal 36 is formed on at least exposed and undoped portions of layer 18. Source/drain metal 36 is formed in the present invention utilizing a conformal deposition process, such as, for example, CVD, PECVD, chemical solution deposition, ALD, sputtering, plating, evaporation or other like processes. In one embodiment of the present invention, the source/drain metal 36 is deposited from a carbon-containing target/source. In one preferred embodiment of the present invention, the source/drain metal 36 is deposited by ALD to increase the current injection areas from metal to nanostructure. In particular, ALD provides a method to provide a uniform coverage of source/drain metal 36 around the circumference of each nanostructure. That is, a sleeve of the source/drain metal 36 can be formed around each of the nanostructures within layer 18.

The source/drain metal 36 comprises any metal or metal-like element that can react with carbon to form a stable binary metal carbide phase. Alternatively, the source/drain metal may include C and optionally other elements. Examples of such source/drain metals include: Al, Si, Sc, Ti, V, Cr, Mn, Fe, Y, Zr, Nb, Mo, Hf, Ta, W and mixtures or alloys thereof. Preferably, at least one of Al, Ti, Cr, Mo, W, Zr, Hf or Ta is used as the source/drain metal 36. The compound formation can be performed in different atmospheres such as, for example, nitrogen, forming gas, chloride, bromide, fluoride, oxygen and others. The variation of ambient gases allows for the formation of different conductive compounds either containing the C from the nanotube or embedding the nanotube itself.

The thickness of the source/drain metal 36 may vary depending on the metal used as well as the technique that was used to form the same. Typically, the thickness of layer 36 is from about 3 to about 200 nm, with a thickness from about 5 to about 20 nm being more typical.

Figure 12:
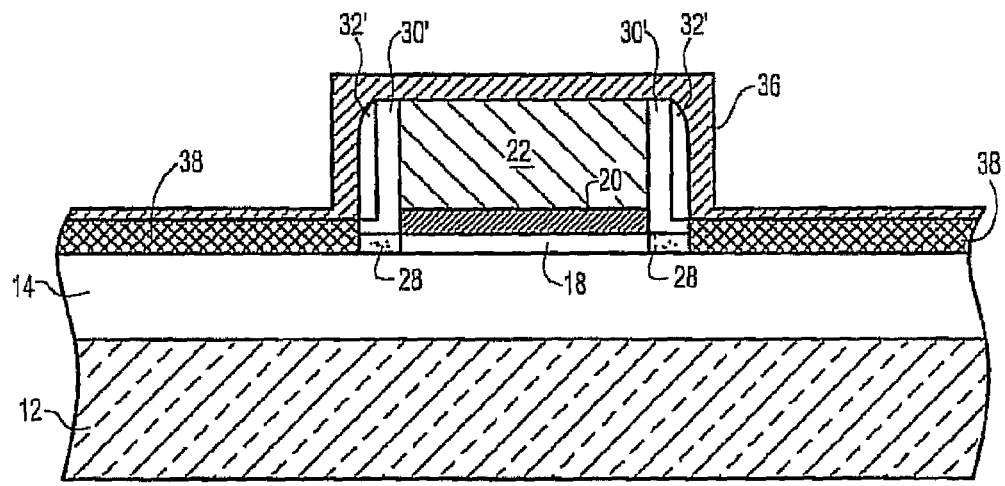
FIG. 12 is a pictorial representation (through a cross sectional view) illustrating the structure of FIG. 11 after performing a carbide annealing step.

After forming the source/drain metal 36 on the structure, the structure containing the same is then subjected to an annealing step that is performed under conditions that cause reaction of the source/drain metal 36 with dopant region 28 containing the nanostructures. The resultant structure that is formed after the anneal has been performed is shown in FIG. 12. As shown, a metal-carbide region 38 forms adjacent to the gate stack 24; the metal-carbide region 38 is aligned to an edge of the gate stack 24 as well as an edge of the remaining layer of one-dimensional nanostructures 18. The remaining layer of one-dimensional nanostructures serves as the device channel. Note that the annealing step may leave some of the source/drain metal 36 on the structure.

In another embodiment (not shown), the anneal causes a reaction between the source/drain metal 36 and an exposed and undoped portion of layer 18. This embodiment would also produce a metal-carbide region. In yet another embodiment, the anneal causes a reaction between the source/drain metal 36, optionally the layer of metal compound 34 and doped or undoped portions of layer 18. In still another embodiment of the present invention, the anneal step causes embedding of one-dimensional nanostructures in a conducting compound region that is generated by reaction of metal and the underlying substrate including C or oxide. When embedding occurs, the spacer needs to be comprised of a nitride so that the etch selectivity is not lost.

The annealing step used at this point of the present invention to cause metal carbide 38 formation is performed at a temperature of about 600° C. or greater. Typically, the metal-carbide formation anneal is performed at a temperature from about 750° to about 1100° C. The metal-carbide formation anneal is performed in an inert ambient such as He, Ar, Ne, Kr, Xe, $N_2$ or mixtures thereof such as He—Ar. The anneal is performed for a time period of sub-milliseconds or greater, with an annealing time from about 10 sec to about 30 min being more typical. The very short time anneal are achieved using laser annealing. The annealing can be performed utilizing a single annealing temperature or multiple annealing temperatures can be used. The annealing may also include various ramp-up cycles, soak cycles, and cool down cycles, as desired.

Figure 13:
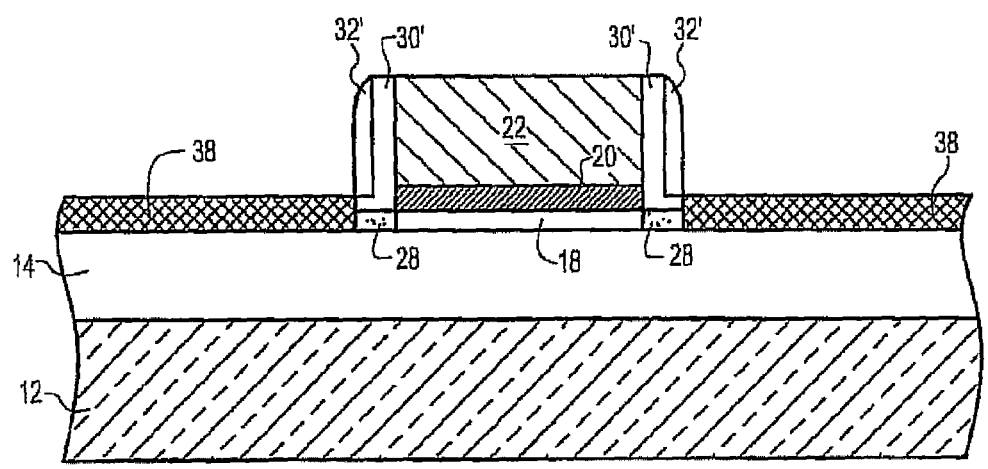
FIG. 13 is a pictorial representation (through a cross sectional view) illustrating the structure of FIG. 12 after etching away excess source/drain metal.
Figure 14:
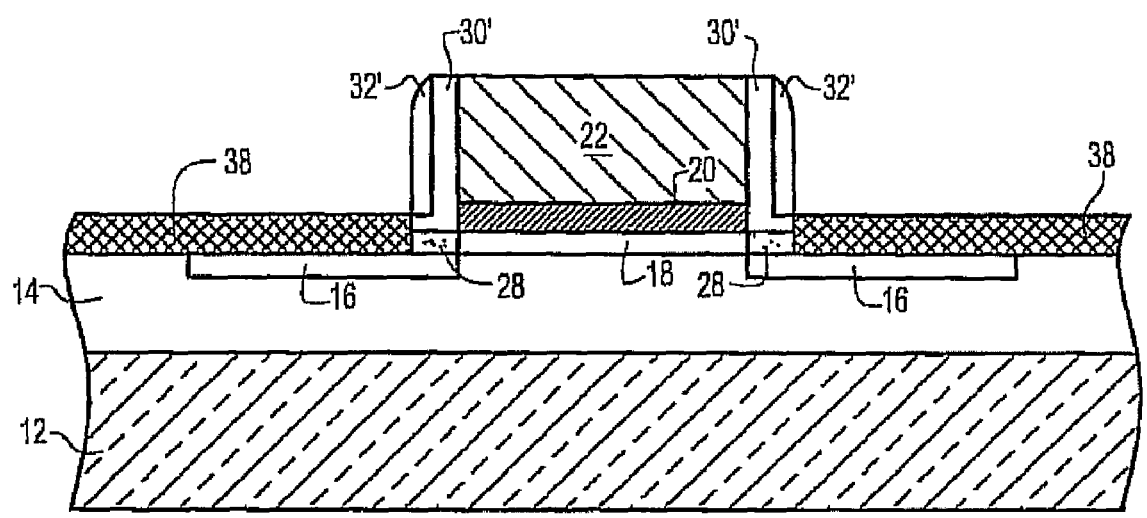
FIG. 14 is a pictorial representation (through a cross sectional view) illustrating a structure similar to that shown in FIG. 13 except that the initial substrate shown in FIG. 11B was employed.

After forming the metal-carbide region 38, the remaining source/drain metal 36 is removed from the structure utilizing an etching process that selectively removes metal as compared with metal carbide. FIG. 13 shows one possible structure that can be formed utilizing the above processing steps. FIG. 14 shows another possible structure that can be formed; FIG. 14 differs from FIG. 13 in terms of the type of initial substrate used. In both instances, a semiconductor structure is illustrated that includes a substrate 10A or 10B comprises at least one gate region located thereon. The at least one gate region comprises a patterned gate stack as well as the remaining layer of one-dimensional nanostructures 18. A metal carbide contact, i.e., region 38, is located on a surface of the substrate and it is aligned to an edge of the least one gate region as well as the remaining layer of one-dimensional nanostructures 18.

While the present invention has been particularly shown and described with respect to preferred embodiments thereof it will be understood by one skilled in the art that the foregoing and other changes in forms and details may be made without departing from the spirit and scope of the invention. It is therefore intended that the present invention is not limited to the exact forms and details described and illustrated, but falls within the spirit and scope of the appended claims.

What is claimed is:

1. A method of fabricating a semiconductor structure comprising:
providing at least one patterned gate stack on one portion of a layer of at least one one-dimensional nanostructure, said at least one patterned gate stack including, from bottom to top, a gate dielectric and a gate electrode, wherein said gate dielectric and said gate electrode have outer edges that are aligned to each other and said layer of at least one one-dimensional nanostructure is located directly on an upper surface of a dielectric layer which is located on an upper surface of a semiconductor layer;
forming at least one spacer on a surface of said layer of at least one one-dimensional nanostructure, wherein an inner edge of said at least one spacer is laterally abutting both a sidewall of both said gate electrode and a sidewall of said gate dielectric;
forming a source/drain metal on other portions of said layer of at least one one-dimensional nanostructure and around said at least one patterned gate stack, said other portions of said layer of at least one one-dimensional nanostructure are laterally adjacent to said one portion of said layer of at least one one-dimensional nanostructure; and
forming a metal carbide by reacting said source/drain metal with said other portions of said layer of at least one one-dimensional nanostructure, wherein said metal carbide contact is aligned to and laterally abuts, but does not overlap, both a sidewall edge of said layer of at least one one-dimensional nanostructure and a sidewall edge of said at least one spacer.

2. The method of claim 1 wherein said layer of at least one one-dimensional nanostructure comprises at least one nanotube.

3. The method claim 1 wherein said layer of at least one one-dimensional nanostructure comprises at least one nanowire.

4. The method of claim 1 wherein said layer of at least one one-dimensional nanostructure comprises a combination of nanotubes and nanowires.

5. The method of claim 1 wherein said layer of at least one one-dimensional nanostructure comprises a C-based nanomaterial.

6. The method of claim 1 wherein said layer of at least one one-dimensional nanostructure is formed by arc-discharge, laser ablation of a carbon target, or chemical vapor deposition.

7. The method of 1 wherein said dielectric layer has regions of a C-containing compound embedded therein.

8. The method of claim 1 further comprising doping said other portions of said layer of at least one one-dimensional nanostructure not present directly beneath said at least one patterned gate stack prior to forming said source/drain metal, said doping comprises electrostatic doping, ion implantation, or gas phase doping.

9. The method of claim 1 wherein said forming said source/drain metal comprises selecting at least one of Al, Si, Sc, Ti, V, Cr, Mn, Fe, Y, Zr, Nb, Mo, Hf, Ta or W and depositing the same.

10. The method of claim 9 wherein said depositing comprises an atomic layer deposition process or deposition from a carbon-containing target.

11. The method of claim 1 further comprising forming a metal compound that functionalizes said other portions of said layer of at least one one-dimensional nanostructure prior to forming said source/drain metal.

12. The method of claim 1 wherein said forming said metal carbide comprises annealing to cause reaction between at least some of the source/drain metal and said other portions of said layer of at least one one-dimensional nanostructure and removing remaining source/drain metal that does not react with said other portions of said layer of at least one one-dimensional nanostructure.

13. The method of claim 12 wherein said annealing is performed in an inert ambient at a temperature of about 600° C. or above.

14. The method of claim 1 wherein said metal carbide is formed by annealing, said annealing also causes at least one of said one-dimensional nanostructures to embed within a conducting compound region.

* * * * *